US012099104B2

(12) United States Patent
Shvartsman et al.

(10) Patent No.: US 12,099,104 B2
(45) Date of Patent: Sep. 24, 2024

(54) PASSIVE SHIELD FOR MAGNETIC RESONANCE IMAGING GRADIENT COILS

(71) Applicant: FUJIFILM Healthcare Americas Corporation, Lexington, MA (US)

(72) Inventors: Shmaryu Shvartsman, Highland Heights, OH (US); Mark Richard, Solon, OH (US); Michael Thompson, Chesterland, OH (US)

(73) Assignee: FUJIFILM HEALTHCARE AMERICAS CORPORATION, Lexington, MA (US)

( * ) Notice: Subject to any disclaimer, the term of this patent is extended or adjusted under 35 U.S.C. 154(b) by 0 days.

(21) Appl. No.: 18/099,755

(22) Filed: Jan. 20, 2023

(65) Prior Publication Data

US 2024/0248159 A1 Jul. 25, 2024

(51) Int. Cl.
*G01R 33/421* (2006.01)
*G01R 33/381* (2006.01)
*G01R 33/385* (2006.01)

(52) U.S. Cl.
CPC ....... *G01R 33/4215* (2013.01); *G01R 33/381* (2013.01); *G01R 33/385* (2013.01)

(58) Field of Classification Search
CPC . G01R 33/4215; G01R 33/381; G01R 33/385
See application file for complete search history.

(56) References Cited

U.S. PATENT DOCUMENTS 4,590,428 A * 5/1986 Muller ............... G01R 33/3875
505/844
4,905,316 A * 2/1990 Okamoto ............. G01R 33/385
324/319

(Continued)

FOREIGN PATENT DOCUMENTS

GB       2297166 A  *  7/1996  ........... G01R 33/385
WO  WO-2016194911 A1 * 12/2016

OTHER PUBLICATIONS

X. Kong et al., "Gradient Coil Design Method Specifically for Permanent-Magnet-Type Low Field Portable MRI Brain Scanner," in IEEE Transactions on Instrumentation and Measurement, vol. 72, pp. 1-12, 2023 (Year: 2023).*

(Continued)

*Primary Examiner* — Daniel R Miller
(74) *Attorney, Agent, or Firm* — Baker Botts L.L.P.

(57) ABSTRACT

An MRI system including a main magnet defining a volume, an imaging region disposed within the volume. The main magnet is configured to produce a uniform main magnetic field within the volume, wherein the uniform magnetic field is oriented along a patient axis. The system includes a gradient magnetic coil assembly disposed within the volume and configured to generate a spatially varying magnetic field across the imaging region. The gradient magnetic coil assembly includes a first coil configured to generate a magnetic field in a first axis, a second coil configured to generate a magnetic field in a second axis, and a third coil configured to generate a magnetic field in the patient axis. The system also includes a passive gradient shield disposed between the main magnet and primary gradient magnetic coil assembly, the passive gradient shield can include a continuous cylindrical layer of high permeability, low electrical conductivity material.

20 Claims, 7 Drawing Sheets

(56) References Cited

U.S. PATENT DOCUMENTS

| | | | |
|---|---|---|---|
| 5,283,544 A | | 2/1994 | Sakurai et al. |
| 5,631,616 A | | 5/1997 | Ohta et al. |
| 5,773,976 A | * | 6/1998 | Sakakura ............ G01R 33/3875 |
| | | | 318/483 |
| 6,150,818 A | | 11/2000 | Barber |
| 6,794,973 B1 | | 9/2004 | Aoki et al. |
| 7,205,766 B2 | | 4/2007 | Miyamoto |
| 7,777,489 B2 | | 8/2010 | Kawamoto |
| 2006/0113997 A1 | * | 6/2006 | Miyamoto ......... G01R 33/3815 |
| | | | 324/318 |
| 2006/0267715 A1 | | 11/2006 | Ni et al. |
| 2007/0255132 A1 | * | 11/2007 | Shalgi ................. A61B 5/062 |
| | | | 600/424 |
| 2008/0204024 A1 | * | 8/2008 | Gao ................... G01R 33/385 |
| | | | 324/318 |
| 2010/0085053 A1 | * | 4/2010 | Iwasa ................ G01R 33/3856 |
| | | | 324/318 |
| 2021/0333341 A1 | * | 10/2021 | Takayanagi .......... G01R 33/385 |

OTHER PUBLICATIONS

Zhang, "An Optimized Target-Field Method for MRI Transverse Biplanar Gradient Coil Design," Meas. Sci. Technol. 22:125505 (2011) 7 pgs.

\* cited by examiner

PASSIVE SHIELD FOR MAGNETIC RESONANCE IMAGING GRADIENT COILS

BACKGROUND

1. Field of Disclosure

The disclosed subject matter is directed to systems and methods for improving magnetic resonance imaging (MRI) systems, and particularly shielding of the gradient coils of MRI systems. The systems and methods described herein provide for passive shielding for MRI gradient coils.

2. Description of Related Art

MRI is a medical diagnostic imaging technique used to diagnose many types of medical conditions. In MRI systems, three electromagnetic fields interact to produce images of anatomy, for example, human anatomy. The three fields include:
1) Main magnetic field—a static, spatially homogenous field to polarize spins of various nuclei within the body, making a net positive population available for detection. The static field must be very homogenous for imaging. For a horizontal field MRI system, the static magnetic field is oriented along the patient axis (head-to-foot) of a patient laying on a horizontal table. This axis is typically referred to as the Z-direction.
2) Gradient magnetic field—a spatially varying field that can create a difference in the z-component of the magnetic field across the imaging region. Additionally, the gradient magnetic field is switched at audio frequencies to encode spin positions and generate contrast. Typically, three spatially varying magnetic fields are created along the orthogonal axes to encode spins in three directions.
3) Radiofrequency (RF) magnetic field—a magnetic field operating at tens of MHz, used to add energy to spins, to detect the associated signals, and generate contrast. The direction of the RF field is orthogonal to the main magnetic field.

MRI systems can include a plurality of hardware components that work in conjunction with specialized software to produce the required magnetic fields and MRI images. MRI systems can include a main magnet, which can generate the main magnetic field, Bo. The main magnet of MRI systems can generate horizontal (aligned with the long axis (head-to-foot) of a patient laying on a horizontal table) or vertical (aligned from back to front of a patient laying on a horizontal table) magnetic fields. Most commonly, the magnetic field generated by the main magnet is 1.5 tesla or 3.0 tesla, but both lower and higher field strengths are also used clinically. Accordingly, the resulting physics for horizontal and vertical systems can be very different.

Within the volume defined by the main magnet can be a gradient magnetic coil assembly. The gradient magnetic coil assembly typically includes three gradient axes to encode spins in three spatial dimensions. The gradient coils can produce substantially linear spatially varying magnetic fields within the imaging volume that are coincident with the direction of the main magnetic field but can vary along the three orthogonal directions (X, Y, Z) of the Cartesian coordinate system. Exemplary gradient coil systems are provided in U.S. Pat. No. 7,482,809, which is incorporated by reference in its entirety.

An RF transmit assembly can be disposed within the volume defined by the gradient magnetic coil assembly, and can generate the RF magnetic field as well as detect resulting signals from the excited tissue.

The gradient and static magnetic fields can interact strongly and make imaging difficult. In particular, the time varying gradient fields can induce unwanted eddy currents into the metal cylinder (the bore) of the main magnet, which in turn creates magnetic fields which distort or interfere with the desired gradient fields. To prevent the generation of eddy currents, the gradient coil and magnet structure (the magnet bore cylinder, magnet windings, or other metal) can be decoupled or isolated, through the use of active shielding. Active shielding refers to the introduction of an extra gradient coil to decouple the flux linkage between the gradient coil and the main magnet's structure. The gradient sub-assembly can be modified to include a set of shielding coils. The inner gradient coil, typically called the primary gradient coil, can be surrounded by an outer gradient coil, typically called the shield gradient coil. The windings of these two coil structures can be designed such that the gradient field generated outside of the bore of the gradient coil structures are predominately canceled, thus preventing substantial eddy currents from being induced in the magnet structure. This type of gradient coil is often called an actively shielded gradient coil, because the electrical current to create the gradient field is run through both the primary coil and the shield coil, thus allowing the shield coil to produce a cancellation field.

Although such a system can improve image quality of MRI systems, it is an expensive solution. Active shield coils subtract from the field of the primary gradient coil, thus decreasing the efficiency of the primary gradient coils in generating a gradient magnetic field. Additionally, the resistance of the gradient coil increases by the addition of the shield coil, thereby increasing the power required to generate magnetic field gradients. This can increase power amplification requirements and heat removal requirements. Furthermore, the additional structure can reduce space for the patient and increase overall noise of the MRI system.

Accordingly, there is a need for coil gradient shields that can reduce eddy currents more efficiently and cost effectively.

SUMMARY

The purposes and advantages of the disclosed subject matter will be set forth in and apparent from the description that follows, as well as will be learned by practice of the disclosed subject matter. Additional advantages of the disclosed subject matter will be realized and attained by the methods and systems particularly pointed out in the written description and claims hereof, as well as the appended figures.

To achieve these and other advantages and in accordance with the purpose of the disclosed subject matter, as embodied and broadly described the disclosed subject matter is directed to systems and methods for passively shielding an MRI gradient coil. For example an MRI system for imaging an imaging region is provided. The system includes a main magnet defining a volume, the imaging region disposed within the volume. The main magnet is configured to produce a uniform main magnetic field within the volume, wherein the uniform magnetic field is oriented along a patient axis. The system includes a gradient magnetic coil assembly disposed within the volume and configured to generate a spatially varying magnetic field across the imaging region. The gradient magnetic coil assembly includes a first coil configured to generate a magnetic field in a first axis, a second coil configured to generate a magnetic field in a second axis, and a third coil configured to generate a magnetic field in the patient axis. The system also includes a passive gradient shield disposed between the main magnet and gradient magnetic coil assembly, the passive gradient shield includes a continuous cylindrical layer of high permeability, low electrical conductivity material.

The high permeability, low electrical conductivity material can be silicon steel. The conductivity, permeability, location, and thickness of the passive shield can be chosen to optimize system performance. The high permeability, low electrical conductivity material can have an initial relative permeability (permeability when no external magnetic field is applied) of 1,000 or more. The high permeability, low electrical conductivity material can have a typical conductivity of $2.5 \times 10^6$ S/m or less. The passive gradient shield can have a thickness of 1 mm or more, with a most typical thickness between 5 and 20 mm.

In accordance with the disclosed subject matter, the passive gradient shield can be integrated into the gradient magnetic coil assembly. For example, the passive gradient shield can be fixed to the gradient magnetic coil assembly by one of epoxy or cold welding. Alternatively, or additionally, the passive gradient shield can be integrated into an interior liner of the main magnet.

In accordance with the disclosed subject matter the passive gradient shield can include a plurality of continuous cylindrical layers of high permeability, low electrical conductivity material, wherein the layers are insulated from one another and laminated together. Additionally, or alternatively, the passive gradient shield can include a plurality of thin slots running longitudinally. The passive gradient shield can include a plurality of patterns of missing material configured to create desirable electromagnetic properties. Additionally or alternatively, the passive gradient shield can include a plurality of thin tubes configured to carry a coolant mixture to set and maintain the passive gradient shield temperature.

The MRI system can include a main magnet passive shimming assembly integrated with the passive gradient shield. The passive gradient shield and main magnet passive shimming assembly can be integrated with the gradient magnetic coil assembly. The MRI system can include an RF assembly, wherein the gradient magnetic coil assembly is disposed between the RF assembly and the main magnet.

In accordance with the disclosed system, the MRI system can include a partially or fully actively shielded gradient coil. The passive gradient shield can be integrated with the partially or fully actively shielded gradient coil.

In accordance with the disclosed subject matter, a gradient subsystem assembly for use in an MRI system is provided. The gradient subassembly can include a gradient magnetic coil assembly including a first coil configured to generate a magnetic field in a first axis, a second coil configured to generate a magnetic field in a second axis, and a third coil configured to generate a magnetic field in a third axis. The assembly can include a passive gradient shield disposed around gradient magnetic coil assembly, the passive gradient shield including a continuous cylindrical layer of high permeability, low electrical conductivity material.

DRAWINGS

DETAILED DESCRIPTION

Reference will now be made in detail to various exemplary embodiments of the disclosed subject matter, exemplary embodiments of which are illustrated in the accompanying drawings. As used in the description and the appended claims, the singular forms, such as "a," "an," "the," and singular nouns, are intended to include the plural forms as well, unless the context clearly indicates otherwise. In accordance with the disclosed subject matter, systems and methods for magnetic resonance imaging (MRI) systems with passive shielding for gradient coils are provided. For example, an MRI system for imaging an imaging region is provided. The system includes a main magnet defining a volume, the imaging region disposed within the volume. The main magnet is configured to produce a uniform main magnetic field within the volume, wherein the uniform magnetic field is oriented along a patient axis. The system includes a gradient magnetic coil assembly disposed within the volume and configured to generate a spatially varying magnetic field across the imaging region. The gradient magnetic coil assembly includes a first coil configured to generate a magnetic field in a first axis, a second coil configured to generate a magnetic field in a second axis, and a third coil configured to generate a magnetic field in the patient axis. The system also includes a passive gradient shield disposed between the main magnet and gradient magnetic coil assembly, where the passive gradient shield is a continuous cylindrical layer of high permeability, low electrical conductivity material.

As described in greater detail below, incorporating a passive gradient shield can increase efficiency of the MRI system, such that less electrical current flowing through the gradient magnetic coil assembly is required to generate the same gradient magnetic field or a higher gradient field can be created with the same electrical current. Additionally, a thinner gradient coil can be used, which can increase the amount of radial space available for a patient. Furthermore, such a system can reduce the cost of the gradient coil and associated power amplifiers and cooling equipment, and can reduce acoustic noise generated by the MRI system.

Figure 1A:
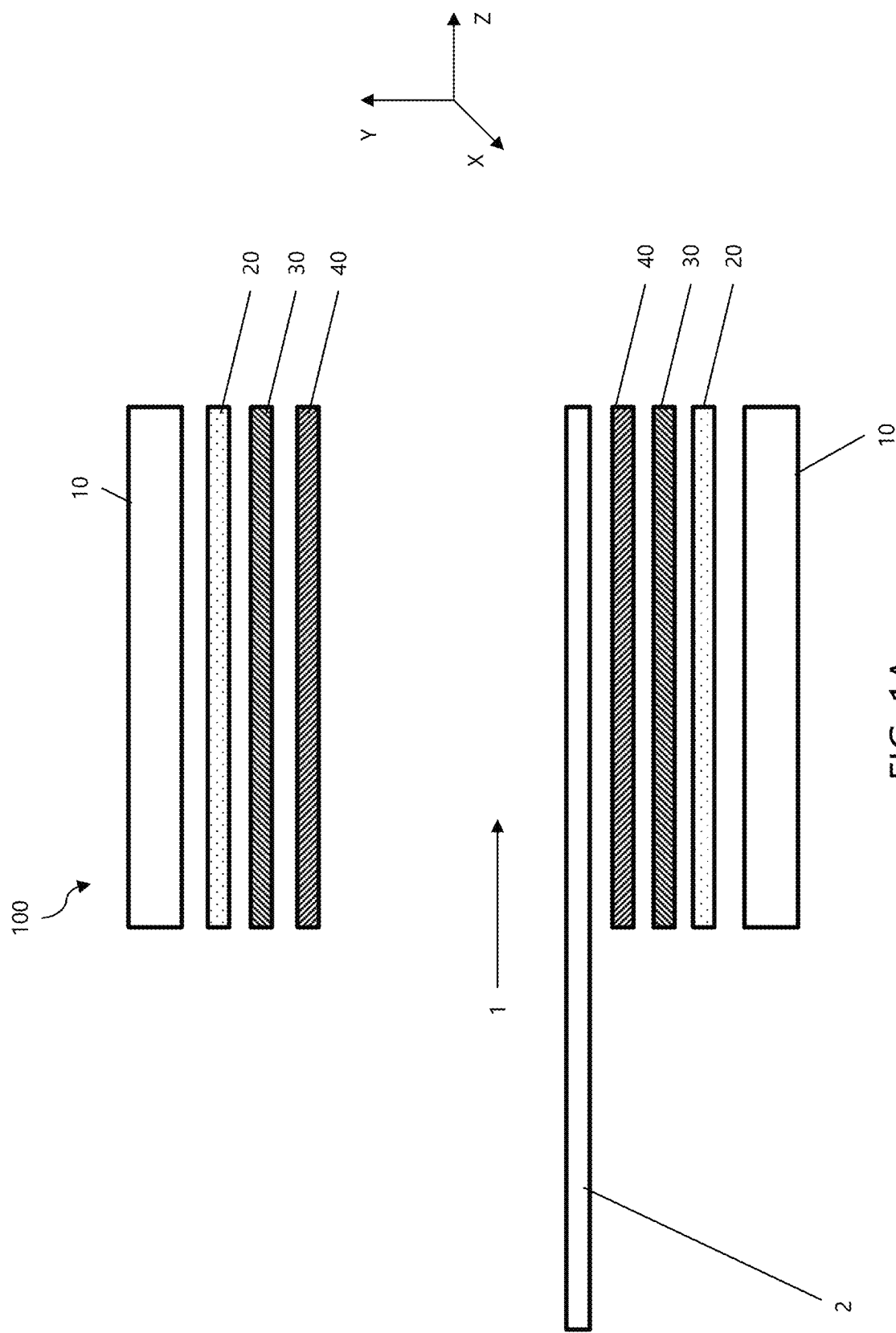
FIGS. 1A and 1B shows a side cutaway view and an end view, respectively, of an MRI system in accordance with the disclosed subject matter.
Figure 1B:
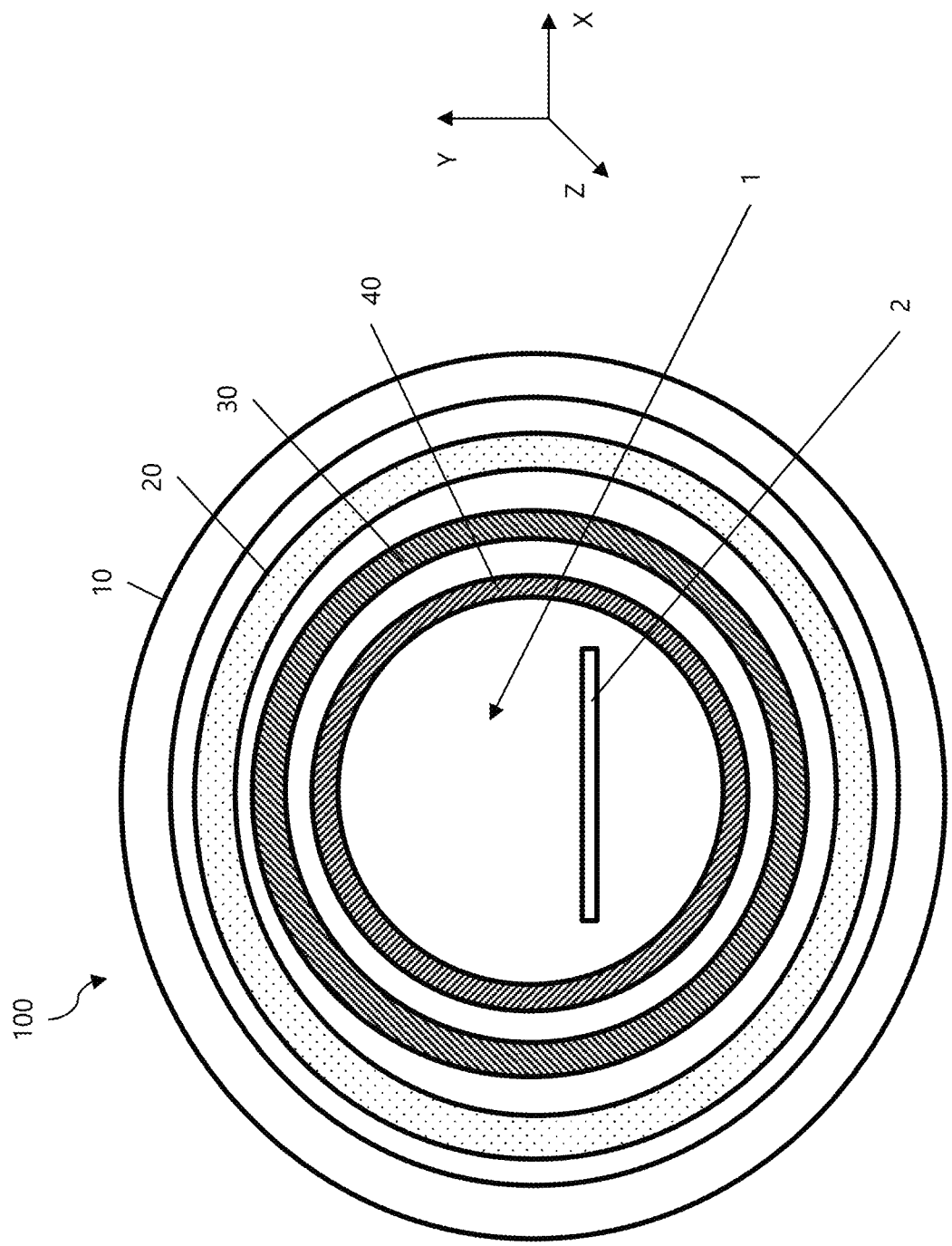
Figure 2:
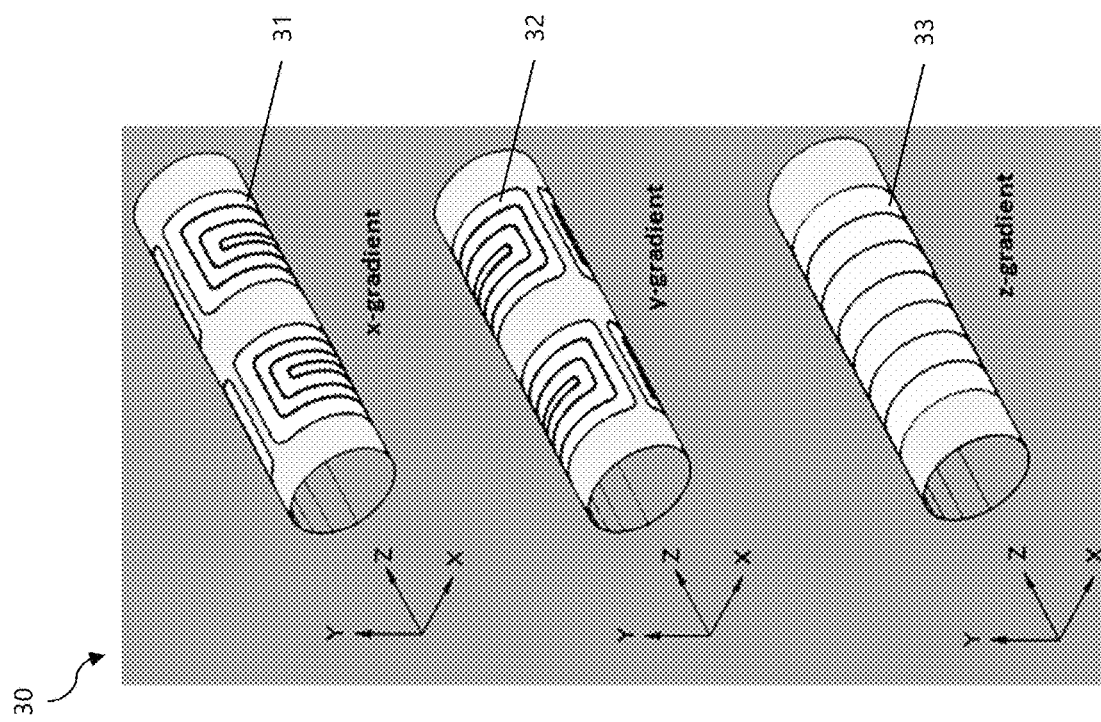
FIG. 2 shows a simplified diagram of elements of a gradient magnetic coil assembly in accordance with the disclosed subject matter.

Referring to FIGS. 1-2 for purpose of illustration and not limitation, an MRI system 100 in accordance with the disclose subject matter is provided. FIG. 1A provides a side, cutaway view of the MRI system 100; FIG. 1B shows an end view of the MRI system 100. The MRI system 100 can be a horizontal MRI system. The MRI system 100 can include a main magnet 10, passive gradient shield 20, a gradient magnetic coil assembly 30, and a radio frequency (RF) assembly 40. A table 2, can be provided to support a patient within the examination region 1. Although the MRI system 100 is described with certain features, any suitable features can be included.

The main magnet 10 can be arranged such that its geometry defines the examination region 1. For example, the main magnet 10 can be a cylindrical tube and can include a magnet warm bore (also referred to as the warm bore) and a cold shield. The main magnet 10 can generate a main magnetic field through the examination region 1. The main magnetic field causes the magnetic moments of a small majority of the various nuclei within the body to be aligned in a parallel or anti-parallel arrangement. The aligned magnetic moments rotate about the equilibriums axis with a frequency that is characteristic for the nuclei to be imaged. The main magnet 100 can be a superconducting primary electromagnetic coil, and can include additional features known in the art, such as cooling systems, such as a cryostat filled with liquid helium, helium gas, or another appropriate cryogen. Due to defects introduced during the manufacturing process, the main magnet 100 necessarily includes correction elements, typically shim trays, to achieve the specified performance levels. These shim trays can be integrated with the gradient assembly (e.g., passive gradient shield 20 and/or gradient magnetic coil assembly 30), though they are a component of the main magnet 100. Since the shim trays can be integrated with the gradient assembly they can also be included with the passive gradient shield 20 of this disclosure, or other features disclosed herein.

The RF assembly 40 can generate a magnetic field operating at tens of Mhz. The RF magnetic field can add energy to spins, detect associated signals, and generate contrast. Particularly, the RF field perturbs the magnetization from its equilibrium state. Upon termination of the application of the RF pulse, the magnetization relaxes to its initial state. During relaxation time, varying magnetic moment induces a detectable time varying voltage in the RF assembly 40. The time varying voltage can be detected by RF assembly 40 in a receive mode of the transmit coil itself, or by an independent receive only coil. For example, the RF assembly 40 can include a single coil assembly configured to send and receive the RF signal, or can include a separate transmit coil assembly and receive coil assembly. The receive assembly can include numerous independent receivers distributed over the region of interest.

Gradient magnetic coil assembly 30 can include a plurality of copper, or other conducting material, sets residing within the main magnet, and can be time varying in order to facilitate the collection of an image. The gradient magnetic coil assembly 30 can include three separate coil sets (31, 32, 33). The three separate coil sets (31, 32, 33) can include one each for each of the coordinate directions X, Y, and Z. FIG. 2 provides, for purpose of illustration and not limitation, a simplified diagram of elements of gradient magnetic coil assembly 30 in accordance with the disclosed subject matter. Coil set 31 provides a magnetic field along the X axis, coil set 32 provides a magnetic field along the Y axis, and coil set 33 provides a magnetic field along the Z axis. For a horizontal field MRI system, together the three coil sets can produce a Z-direction magnetic field, but the intensity of the magnetic field can vary in the X direction, Y direction, and the Z direction, respectively. The gradient magnetic field can be designed to be 0 at the center of the imaging region 1 (known as the isocenter), and linearly increasing in magnitude along each axis, but with opposite polarity on either side of isocenter. Other "gradient" coil assemblies that provide either local or non-linear field variations for spatial encoding can also be employed, and are included within the scope of the disclosed subject matter.

MRI system 100 can include passive gradient shield 20. The passive gradient shield 20 can replace active shielding gradient coils typically used in MRI systems. The passive gradient shield 20 can shield the gradient magnetic coil assembly 30 and have a less deleterious impact on the efficiency of the gradient magnetic coil assembly 30, reduce the power required to operate MRI system 100, require less radial space than a typical active shielding gradient coils, reduce noise of the MRI system 100, and improve decoupling between gradient magnetic coil assembly 30 and main magnet 10. Furthermore, passive gradient shield 20 can reduce costs for production of MRI system 100 and costs for operation of MRI system 100.

The passive gradient shield 20 can be constructed from a high magnetic permeability material which can trap stray magnetic field from the primary gradient coils. The passive gradient shield can also be constructed from a low conductivity material which can reduce eddy currents. For example, the relative permeability can be 1,000 or more. Furthermore, passive gradient shield 20 can be made of low electrical conductivity material, which can reduce the generation of deleterious eddy currents in the shield 20. For example, the conductivity can be less than $2.5 \times 10^6$ S/m. Passive gradient shield 20 can be made of a cylinder, for example, a continuous cylinder, of silicon steel, which is a high magnetic permeability, low electrical conductivity material. Other suitable materials with high magnetic permeability and low electrical conductivity, such as carbon steel, sintered material, or other suitable steel can also be used. In accordance with the disclosed subject matter, the gradient shield 20 can be a cylinder split into halves, quadrants, or octants. This can still be "continuous coverage," from an electrical and magnetic point of view, but for manufacturing purposes, the shield can be built in halve or quadrants or octants. Additionally or alternatively, multiple cylinders can be used with each having a length less than (for example half) the total length of gradient shield 20. For example, gradient shield 20 can be made of two half-tubes. As another example, 8 quarter cylinders can be provided with the length of each being a half of the total length of the gradient shield 20. Such a configuration can include two half-tubes made up of 4 quarter cylinders each.

Passive gradient shield 20 can be a single continuous layer of material formed into a cylinder that can shield all three gradient coils 31, 32, 33. The passive gradient shield 20 can be centered on the gradient magnetic coil assembly 30 to limit the creation of magnetic eddy currents that are asymmetric, and asymmetric forces and torques. The cylinder can have a thickness of about 5 mm and can have a length approximately the same as the cylindrical tube of the main magnet 10. Alternatively, the passive gradient shield 20 can have a thickness of up to 20 mm. The thickness of the passive gradient shield 20 can be selected to be sufficient to reduce eddy currents in the main magnet conducting surfaces to a level equivalent to, or lower than, those afforded by actively shielded gradient coils. Although described with particular dimensions, any suitable dimensions can be used, and can be selected together with other features of the MRI system 100 to sufficiently reduce or control eddy currents.

In accordance with the disclosed subject matter, the passive gradient shield 20 can be integrated with the gradient magnetic coil assembly 30, integrated with the main magnet 10, or provided as a standalone sub-system that can reside between the gradient magnetic coil assembly 30 and the main magnet 10. For example, the passive gradient shield 20 can be fixed to the gradient magnetic coil 30 assembly by one of epoxy or cold welding, or other suitable mechanical fixation. In such a configuration, the passive gradient shield 20 can be an outer layer of the gradient magnetic coil assembly 30. Alternatively, the passive gradient shield 20 can be integrated into the main magnet 10 to form the warm bore liner of the main magnet 10, or otherwise integrated inside the main magnet 10. By integrating the passive gradient shield 20 with the cryostat of the main magnet 10, the passive shielding material can be held at a specific temperature and better shield MRI eddy currents with longer time constants. In accordance with the disclosed subject matter, the passive gradient shield 20 can be divided into multiple layers across multiple sub-assemblies. That is, the passive gradient shield can be integrated into multiple sub-assemblies. For example, the passive gradient shield 20 can be provided as an outer layer of the gradient magnetic coil assembly 30 and as a layer forming the warm bore line of the main magnet 10. As another example, the gradient sub-assembly can include a primary gradient coil at the minimum radius, at the next radius the passive shield, and finally the shim trays at the maximum radius. In accordance with he disclosed subject matter there are multiple permutations of the radial ordering of the gradient and main magnet sub-assemblies. Any suitable permutation of radial ordering can be used, which will recognized by those skilled in the art.

The design and/or integration of one or more features (passive gradient shield 20, gradient magnetic coil assembly 30, and main magnet 10) can be designed to reduce acoustic noise created by the MRI system 100. Such designs can reduce acoustic noise without sacrificing gradient performance. Additionally or alternatively, the design and/or integration can be designed to optimize electromagnetic properties for the target performance specifications. Furthermore, gradient efficiency and space saved by removing an active gradient shield can be used to reduce acoustic noise in the MRI system without sacrificing gradient performance. Additionally or alternatively, the improved efficiency of the gradient system can be used to improve performance of imaging methods, such as echo planar imaging, diffusion weighted imaging, MRI fingerprinting, ultra-fast imaging, and other methods known to those skilled in the art.

In accordance with the disclosed subject matter, a partially or fully actively shielded gradient can also be provided. The partially or fully actively shielded gradient coil can be integrated with the passive gradient shield 20. For example as the field increases, a combination of actively and passive shielding can provide improved performance. Additionally, or alternatively, a passive layer of shielding can be included to improve the isolation of the partially or fully actively shielded gradient coil and the main magnet 10.

Figure 3:
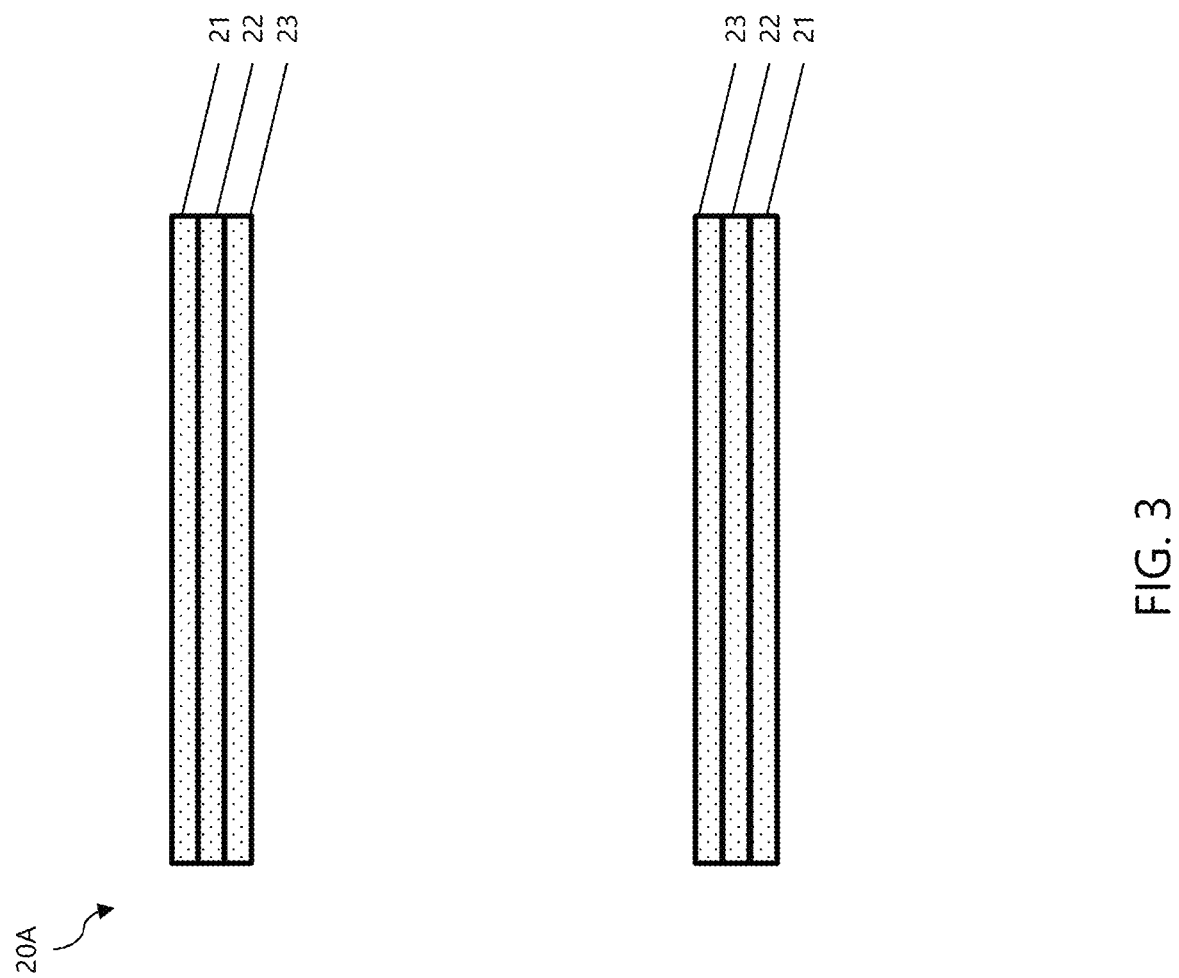
FIG. 3 shows a side cutaway view of a passive gradient shield in accordance with the disclosed subject matter.

FIG. 3 provides, for purpose of illustration and not limitation, a side cutaway view of a passive gradient shield 20A in accordance with the disclosed subject matter. The passive gradient shield 20A can be a cylinder having a plurality of layers 21, 22, 23 of material, such as silicon steel, or other suitable materials, as described above. The layers 21, 22, 23 can be insulated from one another and laminated together. Lamination can be accomplished using a thin layer of bonding material such as prepreg, a sprayed epoxy, or a heat-activated coating applied to the surface of the metal layers. Such a configuration can reduce eddy currents within the cylinder. Although 3 layers are shown, any suitable number of layers can be used, including just 1 layer or over 10 layers. Passive gradient shield 20A can be used as a passive gradient shield in MRI system 100.

Figure 4:
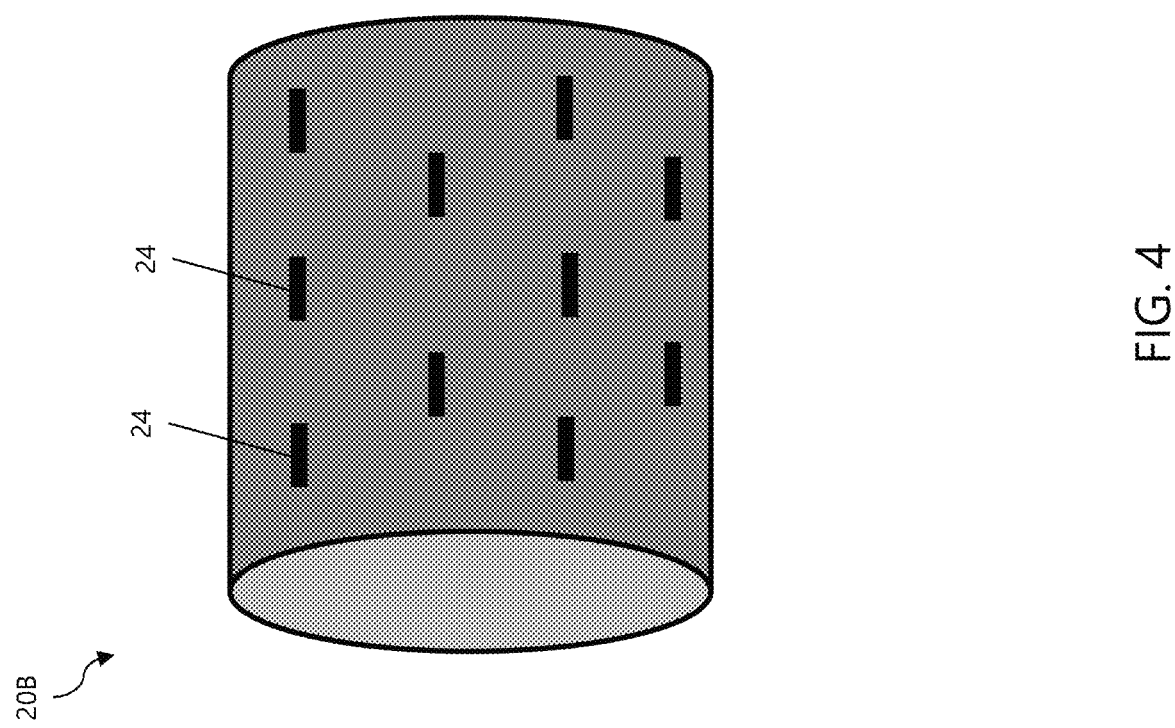
FIG. 4 shows a side view of a passive gradient shield in accordance with the disclosed subject matter.

FIG. 4 provides, for purpose of illustration and not limitation, a side view of a passive gradient shield 20B in accordance with the disclosed subject matter. The passive gradient shield 20B can be a cylinder (as described above with respect to passive gradient shield 20) having thin slots 24 running longitudinally. The slots can reduce eddy currents in the cylinder. In accordance with the disclosed subject matter, the thin slots 24 can run radially. Other patterns of missing material can be introduced on the shield to maintain shielding and modify the electromagnetic behavior of the passive gradient shield. Different patterns can be introduced in different laminated layers in the case that the passive shield is constructed from multiple laminated layers, or distinct layers. Passive gradient shield 20B can be used as a passive gradient shield in MRI system 100.

Figure 5:
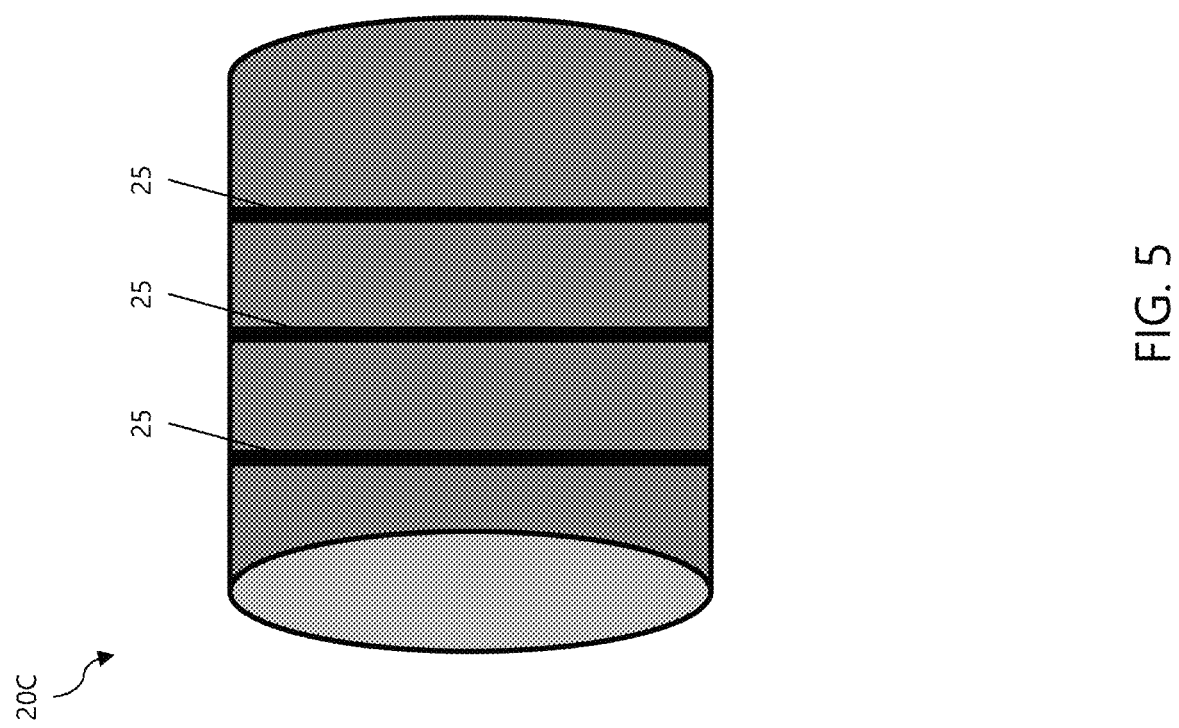
FIG. 5 shows a side view of a passive gradient shield in accordance with the disclosed subject matter.

FIG. 5 provides, for purpose of illustration and not limitation, a side view of a passive gradient shield 20C in accordance with the disclosed subject matter. The passive gradient shield 20C can include tubes 25 carrying a coolant mixture. The tubes 25 can be fastened to the cylinder, such that the cylinder can be kept at a constant temperature via temperature-controlled coolant pumped through the tubes 25. In accordance with the disclosed subject matter, the tubes 25 can be interleaved with the passive gradient shield 20C. Passive gradient shield 20C can be used as a passive gradient shield in MRI system 100. Tubes can also be integrated into the passive shield effectively combining a pattern in the shield and cooling into one assembly performing two functions.

Each of the passive gradient shields 20, 20A, 20B, 20C can include one or more of the features of the other passive gradient shields 20, 20A, 20B, 20C and can be used in MRI system 100.

Introducing passive gradient shield 20, including a high permeability material, into the MRI environment can distort the static field (i.e., the field generated by main magnet 10), which is designed to be highly homogenous. However, static field design can be modified to include the impact of the passive gradient shield 20. The result of the integrated design can provide system optimized for gradient and static field performance. Nevertheless, even absent design modifications, distortions of the static magnetic field caused by the gradient shield 20 can be corrected with shimming technology, as known in the art.

Figure 6B:
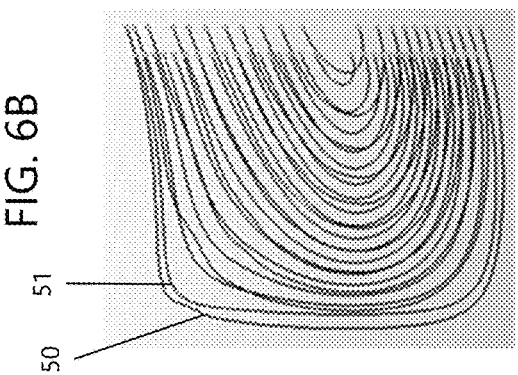
FIGS. 6A-6D show portions of a primary Y coil and Y shield coil.
Figure 6D:
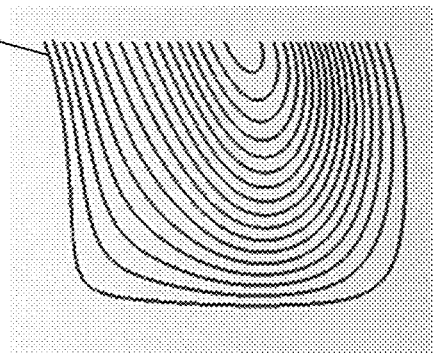
Figure 6A:
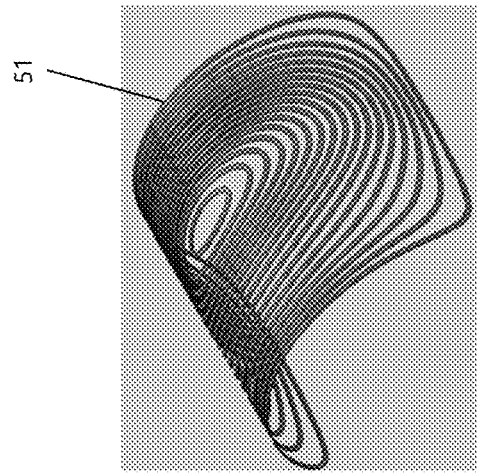
Figure 6C:
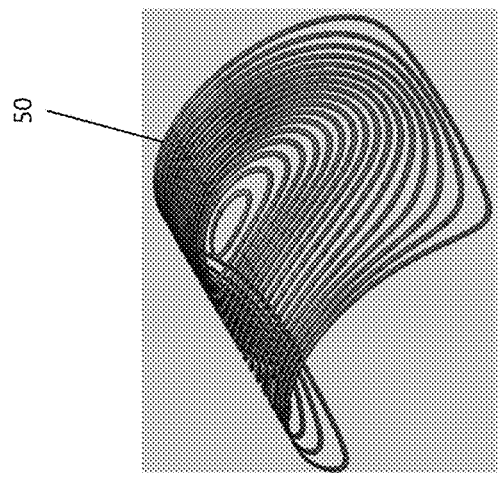

The results of simulations comparing the operation of an actively shielded gradient coil system and a passively shielded gradient coil system which might be used in a typical 1.5T MRI system are described. Simulations used one quadrant only of a Y-axis gradient coil, and used only one quadrant, exploiting symmetry. FIG. 6A provides one quadrant of a primary Y coil, and FIG. 6B provides one quadrant of a shield Y coil. FIG. 6C provides one octant of the primary coil 50, and FIG. 6D provides one octant of the primary coil 50 and shield coil 51. Note that connections between turns are not shown in the images. Parameters of the primary and shield coil are provided in Table 1.

TABLE 1

Parameters of the Primary Coil and Shield Coil

| Parameter | Primary Coil | Shield Coil |
| --- | --- | --- |
| Turns per quadrant | 17 | 11 |
| Conductor thickness | 2 mm | 1.5 mm |
| Conductor Width | 11.3 mm | 15.4 mm |

The gradient coil was simulated with a 38.3 mT/m gradient strength, and the leakage field (unshielded field) which developed upon the inner diameter of the magnet bore was calculated, giving results in Table 2.

TABLE 2

Leakage Field on Inner Surface of Magnet
Warm Bore from Active Shielded Gradient Coil

|     | Bx[mT] | By[mT] | Bz[mT] |
|-----|--------|--------|--------|
| Max | 17.33  | 19.36  | 23.64  |
| Min | −17.33 | −17.96 | −23.64 |

In comparison, the same Primary Gradient coil was used together with a 5 mm thick, silicon steel passive shield surrounding the gradient coil. The leakage field (unshielded field) which developed upon the inner diameter of the magnet bore was calculated, giving results in Table 3.

TABLE 3

Leakage Field on Inner Surface of Magnet
Warm Bore from Gradient Coil with a Passive Shield

|     | Bx[mT] | By[mT] | Bz[mT] |
|-----|--------|--------|--------|
| Max | 1.02   | 0.762  | 1.46   |
| Min | −1.02  | −1.33  | −1.46  |

The improved shielding effectiveness of the Passive Shield is evident in comparing Table 2 and Table 3. Particularly, the maximum and minimum leakage field in each of the directions X, Y, and Z, shows a significant reduction. The advantages of a passive shield for an MRI gradient coil in this particular simulation example are shown in Table 4. Particularly, the sensitivity is increased using the passive shield, and each of the current, voltage, resistance, and DC power required are reduced.

TABLE 4

Results of Simulation Showing
Advantages of Passively Shielded Gradient Coil

|                      | Active Shielded Gradient Coil | Passive Shielded Gradient Coil | % Change |
|----------------------|-------------------------------|--------------------------------|----------|
| Sensitivity [μT/m/A] | 43.45                         | 133.2                          | +207%    |
| Current [A]          | 881                           | 288                            | −67%     |
| Voltage [V]          | 1,800                         | 414                            | −77%     |
| Resistance ['Ω]      | 0.194                         | 0.120                          | −38%     |
| DC Power [kW]        | 135                           | 8.3                            | −94%     |

The disclosed subject matter is also directed to a method of manufacturing an MRI system and/or a gradient magnetic coil assembly having some or all of the features described herein.

In addition to the specific embodiments claimed below, the disclosed subject matter is also directed to other embodiments having any other possible combination of the dependent features claimed below and those disclosed above. As such, the particular features presented in the dependent claims and disclosed above can be combined with each other in other possible combinations. Thus, the foregoing description of specific embodiments of the disclosed subject matter has been presented for purposes of illustration and description. It is not intended to be exhaustive or to limit the disclosed subject matter to those embodiments disclosed.

It will be apparent to those skilled in the art that various modifications and variations can be made in the method and system of the disclosed subject matter without departing from the spirit or scope of the disclosed subject matter. Thus, it is intended that the disclosed subject matter include modifications and variations that are within the scope of the appended claims and their equivalents.

The invention claimed is:

1. A magnetic resonance imaging (MRI) system for imaging an imaging region, the system comprising:
   a main magnet defining a volume, the imaging region disposed within the volume, the main magnet configured to produce a uniform main magnetic field within the volume, wherein the uniform magnetic field is oriented along a patient axis;
   an unshielded gradient magnetic coil assembly disposed within the volume and configured to generate a spatially varying magnetic field across the imaging region, the gradient magnetic coil assembly including a first coil configured to generate a magnetic field in a first axis, a second coil configured to generate a magnetic field in a second axis, and a third coil configured to generate a magnetic field in the patient axis; and
   a passive gradient shield disposed between the main magnet and gradient magnetic coil assembly, the passive gradient shield comprising a plurality of continuous cylindrical layers of high permeability material, wherein the layers are insulated from one another and laminated together.

2. The MRI system of claim 1, wherein the high permeability material comprises silicon steel.

3. The MRI system of claim 1, wherein the high permeability material comprises an initial relative permeability of 1,000 or more.

4. The MRI system of claim 1, wherein the high permeability material comprises a conductivity of $2.5 \times 10^6$ S/m or less.

5. The MRI system of claim 1, wherein the passive gradient shield comprises a thickness between 1 mm and 10 mm.

6. The MRI system of claim 1, wherein the passive gradient shield is integrated into the gradient magnetic coil assembly.

7. The MRI system of claim 6, wherein the passive gradient shield is fixed to the gradient magnetic coil assembly by one of epoxy or cold welding.

8. The MRI system of claim 1, wherein the passive gradient shield is integrated into an interior liner of the main magnet.

9. The MRI system of claim 1, wherein the passive gradient shield further integrates a plurality of thin tubes configured to carry a coolant mixture to set and maintain the passive gradient shield at a temperature.

10. The MRI system of claim 1, further comprising a main magnet passive shimming assembly integrated with the passive gradient shield.

11. The MRI system of claim 10, wherein the passive gradient shield and main magnet passive shimming assembly are integrated with the gradient magnetic coil assembly.

12. The MRI system of claim 1, further comprising a partially or fully actively shielded gradient coil, wherein the passive gradient shield is integrated with the partially or fully actively shielded gradient coil.

13. The MRI system of claim 12, wherein the passive gradient shield is fixed to the gradient magnetic coil assembly by one of epoxy or cold welding.

14. A gradient subsystem assembly for use in a magnetic resonance imaging (MRI) system comprising:
   an unshielded gradient magnetic coil assembly including a first coil configured to generate a magnetic field in a first axis, a second coil configured to generate a magnetic field in a second axis, and a third coil configured to generate a magnetic field in a third axis; and a passive gradient shield disposed around gradient magnetic coil assembly, the passive gradient shield comprising a plurality of continuous cylindrical layers of high permeability material, wherein the layers are insulated from one another and laminated together.

15. The gradient subsystem assembly of claim 14, wherein the high permeability comprises silicon steel.

16. The gradient subsystem assembly of claim 14, wherein the high permeability material comprises an initial relative permeability of 1,000 or more.

17. The gradient subsystem assembly of claim 14, wherein the high permeability material comprises a conductivity of $2.5 \times 10^6$ S/m or less.

18. The gradient subsystem assembly of claim 14, wherein the passive gradient shield comprise a thickness between 1 mm and 10 mm.

19. The gradient subsystem assembly of claim 14, wherein the passive gradient shield is fixed to the gradient magnetic coil assembly by one of epoxy or cold welding.

20. The gradient subsystem assembly of claim 14, wherein the passive gradient shield further integrates a plurality of thin tubes configured to carry a coolant mixture to maintain the passive gradient shield at a constant temperature.

* * * * *